United States Patent [19]

Sakojiri et al.

[11] Patent Number: 4,816,367
[45] Date of Patent: Mar. 28, 1989

[54] MULTICOLOR IMAGING MATERIAL

[75] Inventors: Hiromichi Sakojiri; Hiroshi Takahashi, both of Tokyo, Japan

[73] Assignee: Seiko Instruments Inc., Tokyo, Japan

[21] Appl. No.: 94,277

[22] Filed: Sep. 8, 1987

[30] Foreign Application Priority Data

Feb. 6, 1987 [JP] Japan .................. 62-25647
Mar. 27, 1987 [JP] Japan .................. 62-75514
Jun. 22, 1987 [JP] Japan .................. 62-155223

[51] Int. Cl.[4] .................. G03C 7/00; G03C 1/72; G03C 1/00
[52] U.S. Cl. .................. 430/138; 428/402.2; 428/402.21; 428/402.24; 430/200; 430/211; 430/235; 430/292; 430/944; 430/945
[58] Field of Search .............. 430/138, 200, 211, 235, 430/292, 944, 945; 428/402.2, 402.21, 404.24

[56] References Cited

U.S. PATENT DOCUMENTS

| | | | |
|---|---|---|---|
| 4,343,873 | 8/1982 | Sasaoka | 430/945 |
| 4,399,209 | 8/1983 | Sanders et al. | 430/138 |
| 4,440,846 | 4/1984 | Sanders et al. | 430/138 |
| 4,440,849 | 3/1984 | Krafft | 430/239 |
| 4,501,809 | 2/1985 | Hiraishi et al. | 430/211 |
| 4,529,992 | 7/1985 | Ishida et al. | 430/945 |
| 4,532,200 | 7/1985 | Arney et al. | 430/138 |
| 4,576,891 | 3/1986 | Adair et al. | 430/138 |
| 4,621,040 | 11/1986 | Viola | 430/945 |
| 4,717,650 | 1/1988 | Ikeda et al. | 430/945 |

FOREIGN PATENT DOCUMENTS 2113860  8/1983  United Kingdom .
2160671 12/1985  United Kingdom .

Primary Examiner—Mukund J. Shah
Attorney, Agent, or Firm—Bruce L. Adams; Van C. Wilks

[57] ABSTRACT

A multicolor imaging material comprises a substrate, a capsule layer made up of a plurality of heat-meltable microcapsules including color former and a developer material layer. When the laser beams having wavelengths of $\lambda_1$, $\lambda_2$, and $\lambda_3$ are applied to the multicolor imaging material according to the signals corresponding to three primary colors, the heat-meltable microcapsules for individual colors independently generate heat, thereby causing the heat-meltable substance to be melted. This brings about the reaction of the color formers for individual colors with the developer to developer colors, thereby forming a color image comprised of cyan, magenta and yellow.

17 Claims, 3 Drawing Sheets

FIG.1 　 FIG.2 　 FIG.3
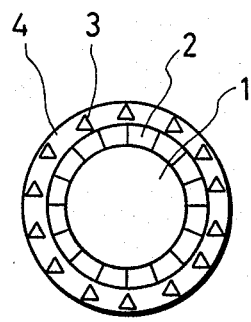
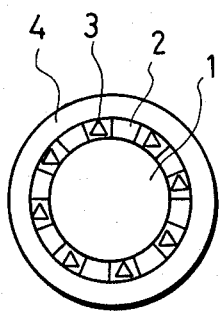
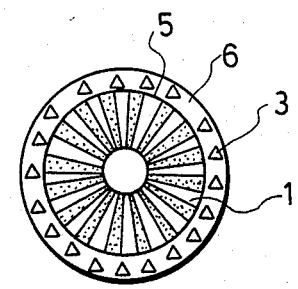
FIG.4
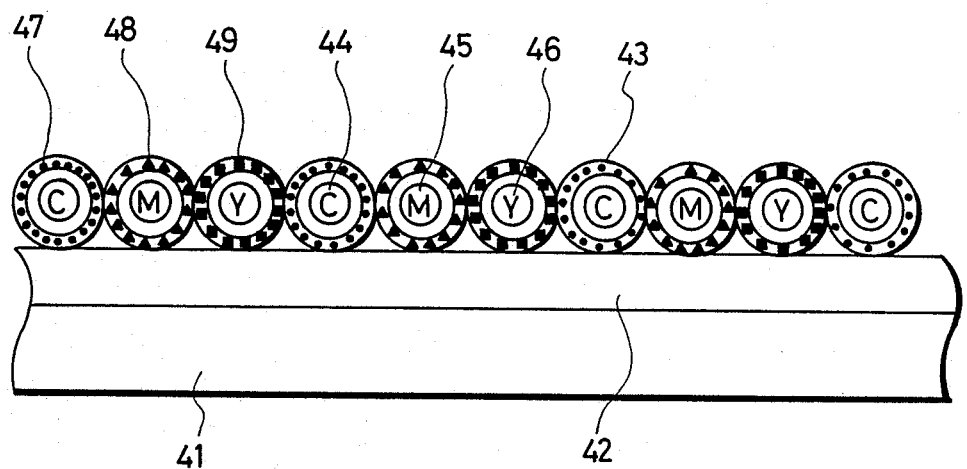

MULTICOLOR IMAGING MATERIAL

BACKGROUND OF THE INVENTION

1 Field of the Invention

The present invention relates to an imaging material and more particularly, to multicolor imaging material for imaging multicolor images utilizing a plurality of infrared rays having different wavelengths.

2. Description of the Prior Art

Recording systems such as electron photography, electrostatic recording, current application recording, heat-sensitive recording, ink jet, etc. have been heretofore known for forming multicolor images. Further, much research has been conducted to develop recording systems utilizing microcapsules, and various systems such as a pressure sensitive recording system, a heat-sensitive recording system and so on have already been invented. A number of patents concern such recording system are disclosed, for example, in U.S. Pat. Nos. 4,399,209, 4,440,849, 4,501,809, 4,621,040 and so on.

U.S. Pat. No. 4,399,209 is directed to a transfer imaging system which comprises a layer of microcapsules wherein a chromogenic material is encapsulated with a photosensitive composition. The photosensitive composition comprises a radiation-curable composition which upon exposure causes an increase in its viscosity thereby preventing diffusion of the chromogenic material upon rupture of the capsule. Upon rupture of the capsules, those capsules in which the radiation-curable material is not activated will release the chromagenic material which will transfer to a developer sheet and react with the developer material to from the image. Similar imaging systems, i.e., a so-called self-contained imaging sheet wherein the developer and the photosensitive encapsule are carried on a single substrate, is are described in U.S. Pat. No. 4,440,846.

A color imaging system employing the aforementioned photosensitive composition encapsulated in pressurerupturable microcapsules is described in British Pat. No. 2113860.

British Pat. No. 2113860 discloses a photosensitive material useful in full color imaging comprising a support having on the surface thereof microcapsules which individually contain cyan, magenta and yellow color formers and photosensitive compositions having distinctly different sensitivities. A uniform mixture of the microcapsules is distributed over the surface of the support. Images are formed by separating the red, green and blue components of the image to be reproduced and translating these components into different wavelengths of actinic radiation to which the photosensitive compositions are distinctly sensitive. The photosensitive material is image-wise exposed to the translated radiation and thereafter it is subjected to a uniform rupturing force, such as pressure, which causes the microcapsules in the underexposed and unexposed areas to rupture and release the color formers. The color formers then react with a developer material which is contained on the same or a different support and produce a full color image.

In these conventional techniques, the ink jet method involves a problem of clotting and is not sufficiently reliable, the other recording methods require many complicated steps for recording the three primary colors repeatedly from CRT, etc. In particular, since the conventional recording material using capsules coloration recording is carried out by reacting one coloring component incorporated in the capsules with the other coloring component present outside the capsules through the rupture of capsule walls caused by applied pressure, a pressure roll which has a force of 200-400 pounds per linear inch to break the capsules is needed.

SUMMARY OF THE INVENTION

In order to solve such disadvantage, the present invention aims at providing multicolor imaging materials from which multicolor images can be obtained in a simple process at a high speed utilizing a plurality of infrared rays having different wavelengths.

Therefore, an object of the present invention is to provide an imaging material which causes color formation utilizing a plurality of infrared rays having different wavelengths.

Another object of the present invention is to provide an imaging material from which multicolor images can be obtained in a simple process at a high speed.

Another more particular object of the present invention is to provide a method for forming an image which is feasible without rupturing capsules by pressure application.

An imaging material in accordance with the present invention comprises a substrate having on one surface thereof, a capsule layer comprising a plurality of heat-meltable microcapsules and a developer material on the substrate.

The multicolor imaging material of the present invention comprises microcapsules having double capsule walls, the inner capsule wall being a porous membrane, the outer capsule wall being composed of a heat-meltable substance or a porous membrane. The microcapsule contains an infrared absorbent which is present in either the inner capsule wall or the outer inner wall. The multicolor imaging material comprises a substrate coated on one surface thereof with an encapsulated composition consisting essentially of an electron donating chromogenic material (hereinafter referred to as "color former") dissolved in an organic solvent. The color former may be soaked in a micro-globule. The micro-globule may be contained in the heat-meltable substance and is wrapped in the infrared absorbent. That is, the infrared absorbent can be present in the porous membrane or in the heat-meltable substance. The imaging material of the present invention is stable during normal handling and under general conditions, but if it is exposed to the infrared ray which is translated from red, green and blue images, the microcapsule is heated through adsorption of the infrared rays and the outer capsule wall is melted. As a result of the melting of the outer capsule wall, the color former contained in the internal phase passes through the inner capsule wall composed of the porous membrane and oozes out, or the coloring component (hereinafter referred to as "developer material") present outside the capsules passes through the capsule wall and permeates into the inside of individual capsules. Whether in the former case or in the latter case, color formation takes place. Accordingly, forming color can be caused by heating in the heated area.

BRIEF DESCRIPTION OF THE DRAWINGS

FIG. 1 illustrates a first embodiment of microcapsule in accordance with present invention;

FIG. 2 illustrates a second embodiment of microcapsule according to the invention;

FIG. 3 illustrates a third embodiment of microcapsule according to the invention;

FIG. 4 shows an example of constructing a multicolor imaging material of the present invention using the microcapsules shown in FIG. 1 or FIG. 2, or the porous micro-globules shouwn in FIG. 3;

DETAILED DESCRIPTION OF THE INVENTION

Figure 5:
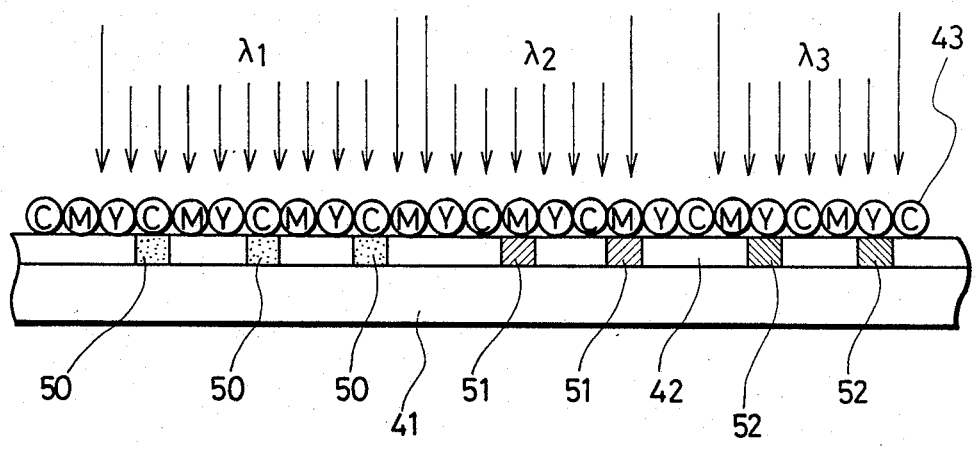
FIG. 5 shows an example of a sketchy multicolor recording using the multicolor imaging material shown in FIG. 4.

The imaging material according to the present invention comprises a substrate having provided thereon a capsule layer comprising a plurality of heat-meltable microcapsules and a developer material for reacting with a color former contained in the microcapsules to form colors. The heat-meltable microcapsule has a capsule wall including an infrared absorbent. The capsule has double capsule walls comprising an inner and outer capsule wall. The inner capsule wall is composed of porous membrane or heat-meltable substance. The infrared absorbent to be used in the present invention includes a substance which absorbs an infrared ray of specified wavelength for causing coloring reaction but which subslantially does not absorb an infrared ray of different wavelength for causing another coloring reaction. That is, the color former such as leuco dye reacts with the developer material to produce the color by absorbing the infrared ray of specified wavelength. The imaging material according to the present invintion enables production of multicolor images at high speed in a simple process utilizing a plurality of infrared rays, characterized by using multicolor imaging materials comprising a substrate having provided thereon at least two microcapsules or porous micro-globules separately containing therein leuco dyes of respective colors capable of forming at least two different colors and color developers for reacting with the leuco dyes to form colors and, also characterized in that these at least two microcapsules or porous micro-globules contain infrared absorbents having different wavelengths for the respective colors in the inner capsule wall wrapping leuco dyes or in the outer capsule wall comprising a porous membrane or a heat-meltable substane.

Hereafter the present invention will be described with reference to the drawings.

FIG. 1 illustrates an example of microcapsules according to the present invention. The microcapsule contains a lueco dye as core material 1, an infrared absorbent 3 and a heat-meltable substance 4. The heat-meltable microcapsule has double capsule walls comprising a porous membrane 2 as an inner capsule wall and the heat-meltable substance 4 as an outer capsule wall. The outer capsule wall may be a porous membrane. FIG. 2 shows a heat-meltable microcapsule which has an inner capsule wall formed by a porous membrane 2 including an infrared absorbent 3. In FIG. 2, the capsule wall 2 is enwrapped with a porous membrane or a heat-meltable substance. FIG. 3 illustrates an example of porous micro-globules in accordance with the present invention. In FIG. 3, the porous microglobules 5 contain a lueco dye 1 enwrapped in a porous membrane or a heat-meltable substance 6. The porous membrane or heat-meltable substance contains an infrared absorbent 3.

FIG. 4 shows an example of constructing a multicolor imaging material of the present invention using the microcapsules shown in FIG. 1 or 2, or the porous micro-globules shown in FIG. 3. A developer material layer 40 which reacts with the lueco dyes to form colors is coated on substrate 41 and, three kinds of microcapsules or porous micro-globules containing cyan lueco dye 44, magenta lueco dye 45 and yellow lueco dye 46 are coated as a homogeneous mixture thereon. The microcapsules or porous micro-globules of cyan, the microcapsules or porous micro-globules of magenta and the microcapsules or porous micro-globules of yellow contain infrared absorbent 47 having a wavelength of $\lambda_1$, infrared absorbent 48 having a wavelength of $\lambda_2$ and infrared absorbent 49 having a wavelength of $\lambda_3$, respectively, at the respective walls or surfaces thereof.

FIG. 5 shows an example of a sketchy multicolor recording using the multicolor imaging material shown in FIG. 4. Upon exposure to infrared rays having wavelengths of $\lambda_1$, $\lambda_2$ and $\lambda_3$ in response to signals of the three primary colors from a CRT, etc., the microcapsules or porous micro-globules 43 of cyan, magenta and yellow are heated correspondingly to the respective wavelengths, whereby the leuco dyes contained in the respective microcapsules or porous micro-globules react with the color developers 42 and cyan color portion 50, magenta color portion 51 and yellow color portion 52 are thus recorded to facilitate recording of multicolor images. In other words, when the infrared rays having wavelengths of $\lambda_1$, $\lambda_2$, and $\lambda_3$ are applied to the imaging material according to the signals corresponding to the three primary colors, e.g., a CRT, the heat-meltable microcapsules for individual colors independently generate heat, thereby causing the heat-meltable substance to be melted. This brings about the reaction of the color former for individual colors with the developer to develop colors, thereby forming a color image comprised of cyan, magenta, and yellow. Three primary colors, i.e., red, green and blue component images translate into infrared rays having wavelength of $\lambda_2$, and $\lambda_3$, infrared rays having wavelength of $\lambda_1$ and $\lambda_3$ and infrared rays having wavelength of $\lambda_1$ and $\lambda_2$, respectively.

As methods for producing the microcapsules or porous micro-globules of the present invention, there can be employed known microencapsulation and surface modification, for example, coacervation method (a phase separation method from an aqueous solution such as disclosed in U.S. Pat. Nos. 2,800,457 and 2,800,458), an interfacial polymerization method, an in situ method by monomer polymerization, spray drying proposed in U.S. Pat. No. 3,111,407, inorganic wall microencapsulation and a fusion-dispersion-cooling method such as disclosed in British Pat. No. 952807. Other suitable methods may be optionally employed. In particular, interface polymerization, in situ polymerization, etc. are preferred as the method for forming the porous membrane. An example of the method for producing double well microcapsules includes a method which comprises microencapsulating an organic solvent containing leuco dyes by interface polymerization, then mixing the microcapsules with a synthetic resin emulsion containing the infrared absorbents to make capsule slurry and then spray drying the slurry to effect double-wall microencapsulation. Further an example of the surface modification of the porous micro-globules includes a method which comprises mixing porous micro-globules immersed in an organic solvent containing leuco dyes with a synthetic resin emulsion containg infrared absorbents to make a capsule slurry and then spray drying the slurry to modify the surface.

Examples of the substances which construct the microcapsules in the present invention include polyamide, polyester, polyurea, polyurethane, urea-formaldehyde resin, melamine resin, etc. as the porous membrane and as the heat-meltable substance, resins having a low melting point such as ethylene-acrylate copolymers, butadiene-styrene copolymers, polyvinyl acetate, etc. Further examples of the porous micro-globules include nylon, polyethylene, etc.

Examples of the infrared absorbents in the present invention include organic compounds such as cyanine dyes, diamine type metal complexes, dithiol type metal complexes, etc. and inorganic compounds such as zinc silicate, magnesium silicate, barium sulfate, barium carbonate, etc.

As the leuco dyes which can be employed in the present invention there can be fluorane derivatives, triphenylmethane derivatives, phenothiazine derivatives, auramine derivatives, spiropyrane derivatives, etc. and specific examples include crystal violet lactome, 3,3-bis(p-dimethylaminophenyl)phthalide, 3,3-bis(p-dimethylaminophenyl)-6-aminophthalide, 3,3bis(p-dimethylamino-phenyl)-6-nitrophthalide, 3,3-bis(p-dimethylamino-phenly)-6-chlorophthalide, 3-dimethylamino-6-methoxyfluorane, 3-dimethylamino-5,7-dimethylfluorane, 3-diethylamino-5,7-dimethylfluorane, 3-diethylamino-5,7-dimethylfluorane, 3-diethylamino-7-methylfluorane, 3,6-bis-$\beta$-methoxyethoxyfuluorane, 3,6-bis-$\beta$-cyanoethoxyfluorane, benzoyl leuco methylene blue, rhodamine B lactam, 3-CP-aminophenyl-phthalide, etc.

Examples of the organic solvent which can dissolve the leuco dyes of the present invention include alkylated naphthalenes, alkylated biphenyls, alkylated terphenyls, chlorinated paraffins, etc.

Examples of the developer material which can be used in the present invention include phenolic compounds such as $\alpha$-naphthol, $\beta$-naphthol, resorcine, hydroquinone, catechol, pyrogallol, etc., activated clay, organic carboxylic acid metal salts, etc.

As the substrate used in the present invention, there are paper, synthetic paper, synthetic resin films, etc.

The multicolor imaging material of the present invention can be coated onto the substrate using a binder.

Examples of the binder include polyvinyl alcohol, methyl cellulose, carboxymethyl cellulose, styrenebutadiene latex, etc.

For coating the multicolor imaging material of the present invention, there can be employed a bar coater, a roll coater, a blade coater, an air knife coater, etc.

As infrared rays for recording in accordance with the present invention, there can be employed a solid laser such as YAG laser, etc.; a gas laser such as a carbon dioxide laser, etc.; an infrared laser such as a semi-conductor laser, etc.

Hereafter the present invention will be described referring to the examples below but is not deemed to be limited thereto.

EXAMPLE 1

Microcapsules A

To 45 parts by weight of diisopropylnaphthalene having dissolved therein 5 parts by weight of terephthalic acid dichloride were added 1.4 parts by weight of benzoyl leuco methylene blue to dissolve. The benzoyl leuco methylene blue solution was mixed with an aqueous solution of 3 parts by weight of polyvinyl alcohol in 97 parts by weight of water and the mixture was emulsified and dispersed with a homogenizer to give a dispersion having a mean particle diameter of 10$\mu$. An aqueous solution of 3 parts by weight of diethylene triamine and 3 parts by weight of sodium carbonate in 24 parts by weight of water was added to the dispersion. The mixture was allowed to stand for 24 hours while stirring to give a capsule solution containing benzoyl leuco methylene blue as a core substance.

Next, the microcapsules were collected by filtration and, 50 parts by weight of the microcapsules were mixed with 50 parts by weight of zinc silicate, 10 parts by weight of styrene-butadiene latex and 150 parts by weight of water. The mixture was stirred to give a capsule slurry. The capsule slurry was subjected to spray drying using a spray drier for experimental use under conditions of an inlet temperature at 130° C., an outlet temperature at 80° C., a pressure of 3.0 kg/cm$^2$ and a solution feed rate of 7 ml/min to obtain Microcapsules A containing zinc silicate in the wall and benzoly leuco methylene blue as the core substance.

Microcapsules B

To 45 parts by weight of diisopropylnaphthalene having dissolved therein 5 parts by weight of terephthalic acid dichloride were added 1.4 parts by weight of rhodamine B lactam to dissolve. The rhodamine B lactam solution was mixed with an aqueous solution of 3 parts by weight of polyvinyl alcohol in 97 parts by weight of water and the mixture was emulsified and dispersed with a homogenizer to give a dispersion having a mean particle diameter of 10$\mu$. An aqueous solution of 3 parts by weight of diethylene triamine and 3 parts by weight of sodium carbonate in 24 parts by weight of water was added to the dispersion. The mixture was allowed to stand for 24 hours while stirring to give a capsule solution containing rhodamine B lactam as a core material.

Next, the microcapsules were collected by filtration and, 50 parts by weight of the microcapsules were mixed with 50 parts by weight of barium sulfate, 10 parts, by weight of styrene-butadiene latex and 150 parts by weight of water. The mixture was stirred to give a capsule slurry. The capsule slurry was subjected to spray drying using a spray drier for experimental use under conditions of an inlet temperature at 130° C., an outlet temperature at 80° C., a pressure of 3.0 kg/cm$^2$ and a solution feed rate of 7 ml/min to obtain Microcapsules A containing barium sulfate in the wall and rhodamine B lactam as the core material.

Microcapsules C

To 45 parts by weight of diisopropylnaphthalene having dissolved therein 5 parts by weight of terephthalic acid dichloride were added 1.4 parts by weight of 3-CP-aminophenyl phthalide to dissolve. The 3-CP-aminophenyl phthalide solution was mixed with an aqueous solution of 3 parts by weight of polyvinyl alcohol in 97 parts by weight of water and the mixture was emulsified and dispersed with a homogenizer to give a dispersion having a mean particle diameter of 10μ. An aqueous solution of 3 parts by weight of diethlene triamine and 3 parts by weight of sodium carbonate in 24 parts by weight of water was added to the dispersion. The mixture was allowed to stand for 24 hours while stirring to give a capsule solution containing 3-CP-aminophenyl phthalide as a core material.

Next, the microcapsules were collected by filtration and, 50 parts by weight of the microcapsules were mixed with 50 parts by weight of magnesium silicate, 10 parts by weight of styrene-butadiene latex and 150 parts by weight of water. The mixture was stirred to give a capsule slurry. The capsule slurry was subjected to spray drying using a spray drier for experimental use under conditions of an inlet temperature at 130° C., an outlet temperature at 80° C., a pressure of 3.0 kg/cm² and a solution feed rate of 7 ml/min to obtain Microcapsules A containing magnesium silicate in the well and 3-CP-aminophenyl phthalide as the core material.

Dispersion

To 100 parts by weight of 5% polyvinyl alcohol aqueous solution were added 30 parts by weight of bisphenol A. The mixture was dispersed for 24 hours in a ball mill to give a dispersion of bisphenol A.

To 40 parts by weight of the bisphenol A dispersion were added 20 parts by weight of Microcapsules A and 20 parts by weight of Microcapsules B thus obtained. The mixture was mixed and made a coating solution. The coating solution was coated onto wood free paper of 50 g/m² in an amount of 20 g/m² (dry weight) using a wire bar, which was dried to give a multicolor imaging material.

Recording was made on the multicolor imaging material at an output of 1.0 W and a scanning rate of 2 m/sec using a carbon dioxide laser having a wavelength of 10.6μ to give color images having a clear cyan color. Next, recording was made at an output of 1.0 W and a scanning rate of 2 m/sec using a carbon dioxide laser having a wavelength of 9.2μ to give color images having a clear magenta color. The cyan and magenta color images showed no color contamination at all.

EXAMPLE 2

A multicolor imaging material was obtained in a manner similar to Example 1 except that Microcapsules C were used in place of Microcapsules B.

Recording was made on the multicolor imaging material under the same conditions as in Example 1 using a carbon dioxide laser having a wavelength of 10.6μ and then using a carbon dixode laser having a wavelength of 9.6μ to give color images having clear cyan and yellow colors. The cyan and yellow color images showed no color contamination at all.

EXAMPLE 3

A multicolor imaging material was obtained in a manner similar to Example 1 except that Microcapsules C were used in place of Microcapsules A.

Recording was made on the multicolor imaging material under the same conditions as in Example 1 using a carbon dioxide laser having a wavelength of 9.2μ and then using a carbon dioxide laser having a wavelength of 9.6μ to give color images having clear magenta and yellow colors. The magenta and yellow color images showed no color contamination at all.

EXAMPLE 4

To 60 parts by weight of a bisphenol A dispersion were added 20 parts by weight of Microcapsules A, 20 parts by weight of Microcapsules B and 20 parts by weight of Microcapsules C in Example 1. The mixture was mixed and made a coating solution. The coating solution was coated onto wood free paper of 50 g/m² in an amount of 20 g/m² (dry weight) using a wire bar, which was dried to give a multicolor imaging material.

Recording was made on the multicolor imaging material under the same conditions as in Example 1 using carbon dioxide lasers having wavelengths of 10.6μ, 9.2μ and 9.6μ to give color images having clear cyan, magenta and yellow colors. The cyan, magenta and yellow color images showed no color contaminating at all.

EXAMPLE 5

Figure 6:
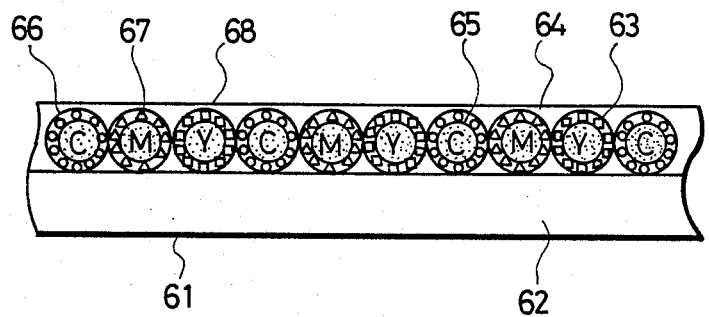
FIG. 6 is a schematic view of the imaging material according to the present invention.

FIG. 6 is a schematic view of an imaging material according to the present arrangement which comprises a substrate coated with porous micro-globules each impregnated with a heat-meltable substance containing either one of cyan magenta, and yellow color forming lueco dyes dispersed therein, enclosed in a material which absorbs a laser beam of a wavelength which varies according to the kind of color, and homogeneously mixed with each other through the medium of a binder in which a developer material is dispersed.

Figure 7:
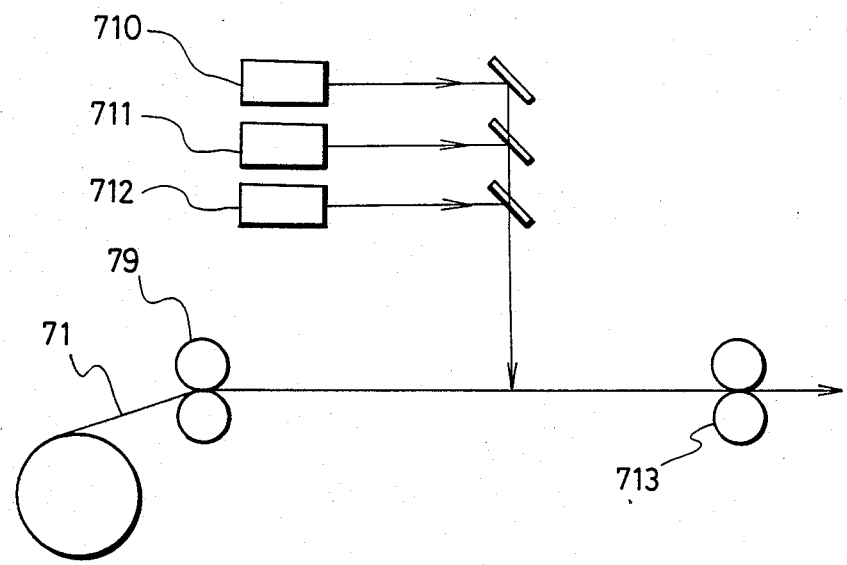
FIG. 7 is a schematic view illustrating the process of recording an image using the imaging material as shown in FIG. 6 through laser beam radiation.

FIG. 7 is an illustration of the process of recording a multicolor image through the exposure of the imaging material as shown in FIG. 6 to laser beams.

When the laser beams having wavelengths of $\lambda_1$, $\lambda_2$, and $\lambda_3$ are applied to the imaging material according to the signals corresponding to three primary colors, e.g., a CRT, the porous micro-globules for individual colors independently generate heat, thereby causing the heat-meltable substance to be fused. This brings about the reaction of the leuco dyes for individual colors with the developer material to develop colors, thereby forming a color image comprised of cyan, magenta, and yellow.

The lueco dyes and developer materials which may be used in the present arrangement include the same compounds as given above.

Examples of the heat-meltable substance include waxes such as paraffin wax, montan wax, and polyethlene wax, and low-boiling resins such as ethylene-acrylate copolymer and butadiene-styrene copolymer.

Examples of the laser beam absorbing material include inorganic oxides, phthalocyanines, and quaternary ammonium salts.

In FIG. 6, the developer material and binder 64 which react with the lueco dyes 65 to form colors are coated on substrate 62 and, three kind of porous micro-globules 63 containing cyan leuco dye, magenta leuco dye and yellow lueco dye are coated as a homogeneous mixture thereon. The porous micro-globules of cyan, magenta or yellow contain a material 66 capable of absorbing a laser beam having a wavelength of $\lambda_1$, a material 67 capable of absorbing a laser beam having a wavelength of $\lambda_2$ or a material 68 capable of absorbing a laser beam having a wavelength of $\lambda_3$, respectively. The porous micro-globules 63 include the lueco dyes and the heat-meltable substance as a core material. In FIG. 7, the reference numerals 710, 711 and 712 indicate an oscillator for a laser beam having a wavelength of $\lambda_1$, $\lambda_2$ and $\lambda_3$, respectively. The reference numerals 79 and 713 indicate pinch rollers. An imaging sheet 71 is exposed to three kind of laser beams having mutually different wavelengths from the oscillators 710, 711 and 712, thereby forming a multicolor image in one process.

EXAMPLE 6

The other arrangement of the present invention will be described as follows. The arrangement directed to a method of exposing a substrate coated with a homogeneous mixture of three kinds of microcapsules respectively containing either one of cyan, magenta and yellow dyes to a laser beam, thereby forming a multicolor image having a high quality at a high speed in one process.

Figure 8:
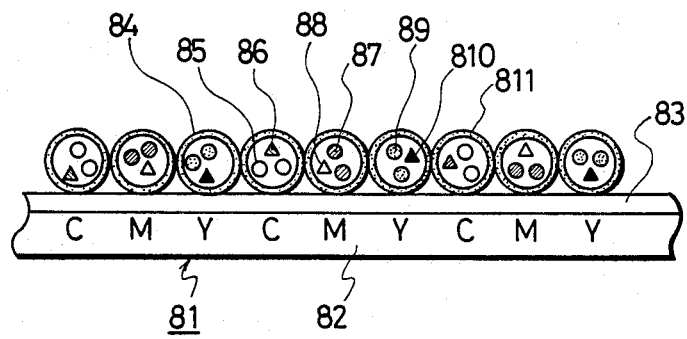
FIG. 8 is a schematic view of an embodiment of an imaging material according to the present invention.

FIG. 8 is a schematic view of a laser color imaging material. In FIG. 8, an imaging material 81 comprises a substrate 82 coated with a color developing layer 83 containing a developer material uniformly dispersed therein and then with a homogeneous mixture of three kinds of micrcapsules 84 respectively containing core material comprised of a combination of either one of cyan-, magenta-, and yellow-developing leuco dyes 85, 86 and 89 with a corresponding decolorizing agent 86, 88 and 810. The leuco dyes and the decolorizing agents as the core materials of the microcapsule are enclosed in a resin 811 which fuses at a temperature which varies according to the kind of colors to be developed. The three kind of microcapsules respectively for cyan, magenta, and yellow each have a capsule wall containing a laser beam absorbing material which generates heat upon being exposed to a laser beam.

The present arrangement will be described in more detail.

The microcapsules respectively for cyan, magenta, and yellow are exposed to three kinds of laser beams having mutually different energy levels so that they develop colors at e.g., temperatures of $T_1$, $T_2$, and $T_3$ ($T_1 < T_2 < T_3$), respectively. The microcapsule for cyan is formed so that a cyan decolorizing agent does not fuse until the temperature reaches $T_2$ although a cyan leuco dye fuses at a temperature of $T_1$. In this case, the cyan leuco dye reacts with the developer at a temperature of $T_1$ to develop a color. The micro-capsule for magenta is formed so that a magenta decolorizing agent does not fuse until the temperature reaches $T_3$ although a magenta leuco dye fuses at a temperature of $T_2$. In this case, the magenta leuco dye reacts with the developer at a temperature of $T_2$ to develop a color. At this temperature, the cyan decolorizing agent fuses in the microcapsule for cyan, which prevents the cyan leuco dye from developing a color. Further, since the microcapsule for yellow does not develop a color until the temperature reaches $T_3$, only magenta is developed at a temperature of $T_2$. The microcapsule for yellow is formed so that a yellow decolorizing agent does not fuse until the temperature reaches $T_4$ ($> T_3$) although a yellow leuco dye fuses at a temperature of $T_3$. In this case, the yellow leuco dye reacts with the developer at a temperature of $T_3$ to develop a color. At this temperature, the decolorizing agents in the microcapsules for cyan and magenta fuse, which prevents the cyan, magenta, and yellow leuco dyes from developing colors. Thus, the microcapsules respectively for cyan, magenta, and yellow independently develop colors at different temperatures, which leads to the realization of recording of a multicolor image in one process through radiation of three kinds of laser beam having mutually different energy levels.

The lueco dyes which may be used in the present arrangement include compounds as described above.

Examples of the decolorizing agent include polyethylene oxide, polyoxydecamethylene oleyl ether, tripropylcarbinol, 2,5-dimethyl-3-hexy-2,5-diol, and pentamethylglycerin.

Examples of the developer include phenolic compounds such as α-naphthol, β-naphthol, resorcinol, hyroquinone, catechol, and pyrogallol, activated clay, and metal salts of organic carboxylec acids.

Examples of the heat-meltable substance for enclosing the leuco dye and the decolorizing agnt therein include waxes such as paraffin wax, montan wax, and polyethylene wax, and low boiling resins such as ethylene-acrylate coplymer, butadiene and styrene copolymer.

Examples of the laser beam absorbing material include inorganic oxides, phthalocyanines, and quaternary ammonium salts.

The process for forming color images employing the sheet is similar to that above described as shown in FIG. 7.

When the laser color recording sheet 81 is exposed to laser beams $\lambda_1$, $\lambda_2$, and $\lambda_3$ having mutually different energy levels to raise the temperatures respectively to $T_1$, $T_2$, and $T_3$, the corresponding microcapsule 84 of the laser color recording sheet 81 develops a color to record a multicolor image.

As has been described hereinabove, the present invention enables production of multicolor images at high speed in a simple process utilizing a plurality of infrared rays, characterized by using multicolor recording materials comprising a substrate having provided thereon at least two microcapsules or porous micro-globules separately containing therein color formers of respective colors capable of forming at least two different colors and color developers capable of reacting with the color formers to form colors and, also characterized in that these at least two microcapsules or porous microglobules contain infrared absorbents having different wavelengths for the respective colors in the wall or at the surface thereof.

What is claimed is:

1. A multicolor imaging material comprising:
   a substrate;
   a capsule layer made up of a plurality of heat-meltable microcapsules, said heat-meltable microcapsules separately containing therein color formers of respective colors capable of forming at least two different colors and infrared absorbents which absorb different wavelengths for the respective colors, said microcapsule having a porous membrane which encloses the color former; and
   a developer material layer formed on the substrate or coexisted with the microcapsules, said developer material reacting with the color former to produce a color image.

2. A multicolor imaging material of claim 1; wherein said heat-meltable microcapsule comprises double capsule walls, the inner capsule wall formed by porous membrane which envelops the color former and the outer capsule will adjacent to the inner capsule wall.

3. A multicolor imaging material of claim 2; wherein said outer capsule wall comprises a heat-meltable substance containing the infrared absorbents.

4. A multicolor imaging material of claim 2; wherein said outer capsule well comprises a porous membrane containing the infrared absorbents.

5. A multicolor imaging material of claim 2; wherein said inner capsule wall contains the infrared absorbents and said outer capsule wall comprises a heat-meltable substance.

6. A multicolor imaging material of claim 2; wherein said inner capsule wall contains the infrared absorbents and said outer capsule wall comprises a porous membrane.

7. A multicolor imaging material of claim 1; wherein said heat-meltable microcapsule comprises a porous micro-globule containing the color former and a layer which coats the porous micro-globule.

8. A multicolor imaging material of claim 7; wherein said coating layer comprises a heat-meltable substance containing the infrared absorbents.

9. A multicolor imaging material of claim 7; wherein said coating layer comprises a porous membrane containing the infrared absorbents.

10. A multicolor imaging material of claim 1; wherein said heat-meltable microcapsule comprises a porous micro-globule containing the color former and a heat-meltable substance and a layer which coats the porous micro-globule, said layer being composed of infrared absorbents.

11. A multicolor imaging material comprising:
a substrate;
a capsule layer made up of a plurality of microcapsules, said microcapsules comprising a color former and a capsule wall containing an infrared absorbent which absorbs an infrared ray of specified wavelength for causing the system to produce its color but which substantially does not absorb an infrared ray of different wavelength for causing another system to produce the color; and
a developer material layer formed on the substrate or coexisted with the microcapsules.

12. A multicolor imaging material of claim 11; wherein said microcapsule is a heat-meltable microcapsule having the infrared absorbent, said color former being wrapped in a porous membrane.

13. A multicolor imaging material of claim 12; wherein said infrared absorbent is contained in the heat-meltable substance or the porous membrane.

14. A multicolor imaging material of claim 11; wherein said microcapsule is a heat-meltable microcapsule comprising a porous micro-globule including the color former and a heat-meltable substance, the porous micro-globule being wrapped in the infrared absorbent.

15. A process for forming color images employing a multicolor imaging material comprising a substrate, a capsule layer made up of three kinds of heat-meltable microcapsules, each of said microcapsule containing a cyan color former and infrared absorbent absorbing a wavelength of $\lambda_1$, a magenta color former and infrared absorbent absorbing a wavelength of $\lambda_2$ and a yellow color former and infrared absorbent absorbing a wavelength of $\lambda_3$ and a developer material layer formed on the substrate or coexisted with the microcapsules, said process comprising:
(a) resolving a multicolor image into its red, green and blue component images,
(b) translating, individually, each of said red, green and blue images into a signal which generates an infrared ray, said infrared ray being actinic with respect to the infrared absorbent contained in the microcapsule,
(c) irradiating the infrared rays to the multicolor imaging material whereby the microcapsules are heated by absorbing the infrared rays, and
(d) producing multicolor image by reacting the color former and the developer material.

16. A process for forming color images according to claim 15; wherein said color former is lueco dye.

17. A process for forming color images according to claim 15; wherein said red, green and blue component images translate into infrared rays having wavelength of $\lambda_2$ and $\lambda_3$, infrared rays having wavelength of $\lambda_1$ and $\lambda_3$ and infrared rays having wavelength of $\lambda_1$ and $\lambda_2$, respectively.

* * * * *